(12) United States Patent
Oh et al.

(10) Patent No.: US 12,080,526 B2
(45) Date of Patent: Sep. 3, 2024

(54) SUBSTRATE PROCESSING APPARATUS

(71) Applicant: JUSUNG ENGINEERING CO., LTD., Gwangju-si (KR)

(72) Inventors: Woong Kyo Oh, Gwangju-si (KR); Young Woon Kim, Gwangju-si (KR); Kwang Su Yoo, Gwangju-si (KR); Do Hyung Kim, Gwangju-si (KR); Yun Gyu Ha, Gwangju-si (KR)

(73) Assignee: JUSUNG ENGINEERING CO., LTD. (KR)

( * ) Notice: Subject to any disclaimer, the term of this patent is extended or adjusted under 35 U.S.C. 154(b) by 210 days.

(21) Appl. No.: 17/625,730

(22) PCT Filed: Jul. 9, 2020

(86) PCT No.: PCT/KR2020/009047
§ 371 (c)(1),
(2) Date: Jan. 7, 2022

(87) PCT Pub. No.: WO2021/006676
PCT Pub. Date: Jan. 14, 2021

(65) Prior Publication Data
US 2022/0285135 A1 Sep. 8, 2022

(30) Foreign Application Priority Data
Jul. 10, 2019 (KR) .......................... 10-2019-0083462

(51) Int. Cl.
*H01J 37/32* (2006.01)
(52) U.S. Cl.
CPC .... *H01J 37/32559* (2013.01); *H01J 37/3244* (2013.01); *H01J 37/32541* (2013.01); *H01J 37/32568* (2013.01); *H01J 2237/332* (2013.01)

(58) Field of Classification Search
CPC .................. H01J 37/32532; H01J 37/32541
See application file for complete search history.

(56) References Cited

U.S. PATENT DOCUMENTS

2008/0302303 A1* 12/2008 Choi ................. C23C 16/45565
438/758
2015/0303037 A1 10/2015 Ha et al.

FOREIGN PATENT DOCUMENTS

JP          5895603 B2     3/2016
JP       2016128593 A     7/2016
(Continued)

OTHER PUBLICATIONS

International Search Report for PCT/KR2020/009047 mailed Nov. 2, 2020.

*Primary Examiner* — Joseph A Miller, Jr.
(74) *Attorney, Agent, or Firm* — Renaissance IP Law Group LLP

(57) ABSTRACT

The present disclosure relates to a substrate processing apparatus capable of improving efficiency in a substrate processing process by adjusting a flow rate and residence time of gas and a plasma density according to process conditions. The substrate processing apparatus according to the embodiment of the present disclosure is advantageous in that it can enhance efficiency in the substrate processing process by decreasing the flow rate and increasing residence time of gas and the plasma density in the process of supplying the gas through the shape forming of the gas injection module including the first and second injection plates.

10 Claims, 16 Drawing Sheets

(56) References Cited

FOREIGN PATENT DOCUMENTS

| KR | 20110074854 A | 7/2011 |
| KR | 101119797 B1 | 3/2012 |
| KR | 101160906 B1 | 6/2012 |
| KR | 101585891 B1 | 1/2016 |

* cited by examiner

SUBSTRATE PROCESSING APPARATUS

BACKGROUND

1. Technical Field

The present disclosure relates to a substrate processing apparatus, and more particularly, to a substrate processing apparatus capable of improving efficiency in a substrate processing process by adjusting a flow rate and residence time of gas and a plasma density according to process conditions.

2. Related Art

In general, thin film layers, thin film circuit patterns, and/or optical patterns are required to be formed on a substrate in order to manufacture semiconductor devices, flat panel displays, solar cells, or the like. To this end, processes, such as a deposition process of depositing on a substrate a thin film made of a specific material, a photo process of selectively exposing the thin film by means of a photosensitive material, and an etching process of selectively removing an exposed portion of the thin film to form a pattern, are performed on the substrate.

The processes of processing the substrate are performed by a substrate processing apparatus. A conventional substrate processing apparatus includes a chamber for processing a substrate, a substrate support for supporting the substrate, and an electrode unit disposed above the substrate support. The conventional substrate processing apparatus performs the processing of the substrate by supplying gas to the substrate through the electrode unit.

On the other hand, the conventional substrate processing apparatus includes a lower electrode with gas inlet and outlet surfaces having a flat shape thereon, and an upper electrode with gas supply passages, the diameters of which are equal in size, at the center and outer portions thereof.

For this reason, the conventional substrate processing apparatus does not take into account the flow rate and residence time of gas and the difference between plasma densities at the center and outer portions of the upper electrode in the process of supplying the gas through the lower electrode, which leads to deterioration in processing efficiency of the substrate. In addition, it is difficult to form a uniform thin film on the substrate in the large-area substrate processing apparatus.

SUMMARY

Various embodiments are directed to a substrate processing apparatus configured such that a second electrode as a lower electrode has an insertion hole through which gas is supplied, an opening area of an inlet of the insertion hole is gradually increased from the center toward the edge of the second electrode, and the second electrode has a concave dome-shaped lower surface. Accordingly, the substrate processing apparatus can increase a residence time of gas by reducing a flow rate of the gas at the edge rather than the center of the second electrode, form a uniform thin film by increasing a plasma density, and enhance efficiency in a substrate processing process.

In an embodiment, there is provided a substrate processing apparatus that includes a process chamber configured to provide a reaction space for processing a substrate, a substrate support configured to support the substrate, a first electrode installed in the process chamber to face the substrate and having a plurality of protruding electrodes protruding toward the substrate, and a second electrode positioned beneath the first electrode and having a plurality of insertion holes into which the respective protruding electrodes are inserted. Each of the insertion holes of the second electrode includes a first hole at its upper portion, an associated one of the protruding electrodes being inserted into the first hole, and a second hole at its lower portion facing the upper portion. The first hole has a first opening, and the second hole has a second opening. An area of the first opening at a center of the second electrode is different from an area of the first opening at an edge of the second electrode.

In another embodiment, there is provided a substrate processing apparatus that includes a process chamber configured to provide a reaction space for processing a substrate, a substrate support configured to support the substrate, a first injection plate installed in the process chamber to face the substrate, and having a first gas injection hole therein and a plurality of protruding nozzles protruding toward the substrate, and a second injection plate positioned beneath the first injection plate, and having a plurality of second gas injection holes into which the respective protruding nozzles are inserted and through which second gas is injected. Each of the second gas injection holes of the second injection plate includes a first hole at its upper portion, an associated one of the protruding nozzles being inserted into the first hole, and a second hole at its lower portion facing the upper portion. The first hole has a first opening, and the second hole has a second opening. An area of the first opening at a center of the second injection plate is different from an area of the first opening at an edge of the second injection plate.

DETAILED DESCRIPTION

Figure 1:
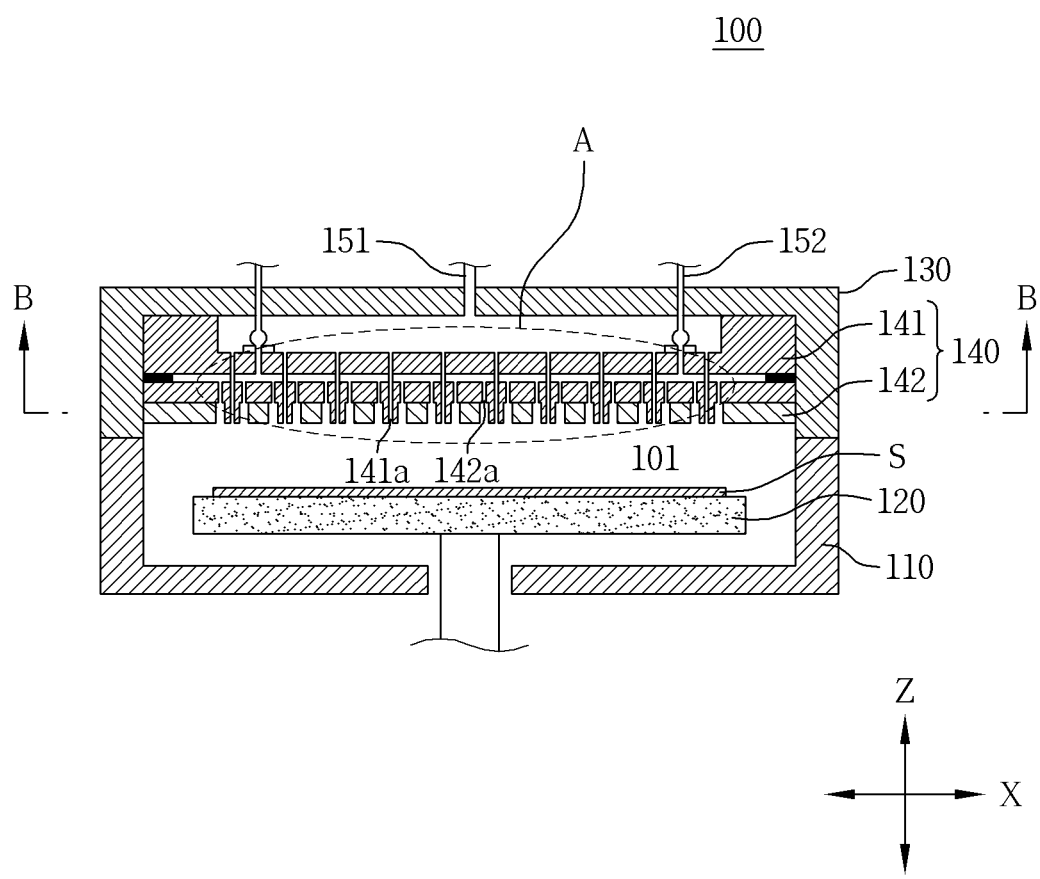
FIG. 1 is a cross-sectional view illustrating a substrate processing apparatus according to an embodiment of the present disclosure.

Exemplary embodiments will be described below in more detail with reference to the accompanying drawings. The disclosure may, however, be embodied in different forms and should not be constructed as limited to the embodiments set forth herein. Rather, these embodiments are provided so that this disclosure will be thorough and complete, and will fully convey the scope of the disclosure to those skilled in the art. Throughout the disclosure, like reference numerals refer to like parts throughout the various figures and embodiments of the disclosure.

FIG. 1 is a cross-sectional view illustrating a substrate processing apparatus according to an embodiment of the present disclosure.

As illustrated in FIG. 1, the substrate processing apparatus, which is designated by reference numeral 100, according to the embodiment of the present disclosure includes a process chamber 110, a substrate support 120, a chamber lid 130, and an electrode module 140 including a first electrode 141 and a second electrode 142 which face the substrate support.

The process chamber 110 provides a reaction space 101 for processing a substrate(s). The bottom on one side of the process chamber 110 may communicate with an exhaust port (not shown) for exhausting gas from the reaction space 101.

The substrate support 120 is installed inside the process chamber 110 and supports a plurality of substrates S or a single large-area substrate S. The substrate support 120 is supported by a support shaft (not shown) passing through the central bottom of the process chamber 110. The support shaft exposed out of the lower surface of the process chamber 110 is sealed by a bellows (not shown) installed on the lower surface of the process chamber 110. The substrate support 120 may be raised or lowered by a drive unit (not shown), and may also be rotated by driving the drive unit in some cases.

The chamber lid 130 is installed to cover the upper portion of the process chamber 110 to seal the reaction space 101. The chamber lid 130 supports the electrode module 140, which includes the first electrode 141 as an upper electrode and the second electrode 142 as a lower electrode, and the electrode module 140 is inserted into and detachably coupled to the chamber lid 130.

The chamber lid 130 may be provided, on the upper surface thereof, with a first gas supply unit (not shown) and a second gas supply unit (not shown) to supply first gas and second gas to the electrode module 140 within the process chamber 110.

The first gas supply unit (not shown) supplies reaction gas as the first gas to the electrode module 140 through a first gas supply line 151. The reaction gas refers to gas for plasma formation or for incidental reaction. For example, the reaction gas may be comprised of hydrogen ($H_2$), nitrogen ($N_2$), oxygen ($O_2$), nitrogen dioxide ($N_2O$), ammonia ($NH_3$), water ($H_2O$), ozone ($O_3$), or the like.

The second gas supply unit (not shown) supplies source gas as the second gas to the electrode module 140 through a second gas supply line 152. The source gas refers to gas containing a main component of a thin film to be formed. For example, the source gas may be gas containing silicon (Si), a titanium group element (e.g., Ti, Zr, or Hf), aluminum (Al), or the like.

A plasma power supply (not shown) for supply of plasma power may be installed outside the process chamber 110.

The first and second electrodes 141 and 142 of the electrode module 140 may be detachably coupled to the upper portion of the process chamber so as to face the substrate support 120.

The first electrode 141 may have a structure such as a polygonal flat plate or a circular plate. The first electrode 141 may include a plurality of integral or separate protruding electrodes 141a, and the protruding electrodes 141a may be connected to the first electrode 141 to have the same voltage as the first electrode 141.

The second electrode 142 may have a structure such as a polygonal flat plate or a circular plate. The second electrode 142 may be installed in the process chamber and a have a plurality of insertion holes 142a formed to allow the respective protruding electrodes 141a to pass therethrough.

Figure 2:
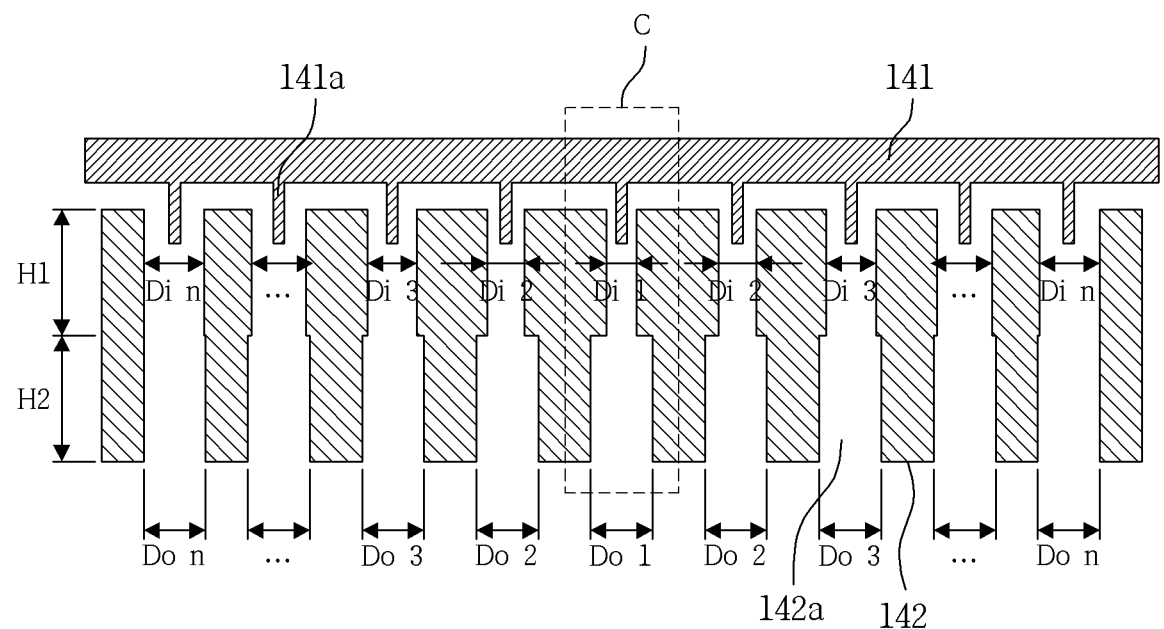
FIG. 2 is an enlarged view illustrating a first example of portion "A" of FIG. 1 in the substrate processing apparatus according to the embodiment of the present disclosure.
Figure 3:
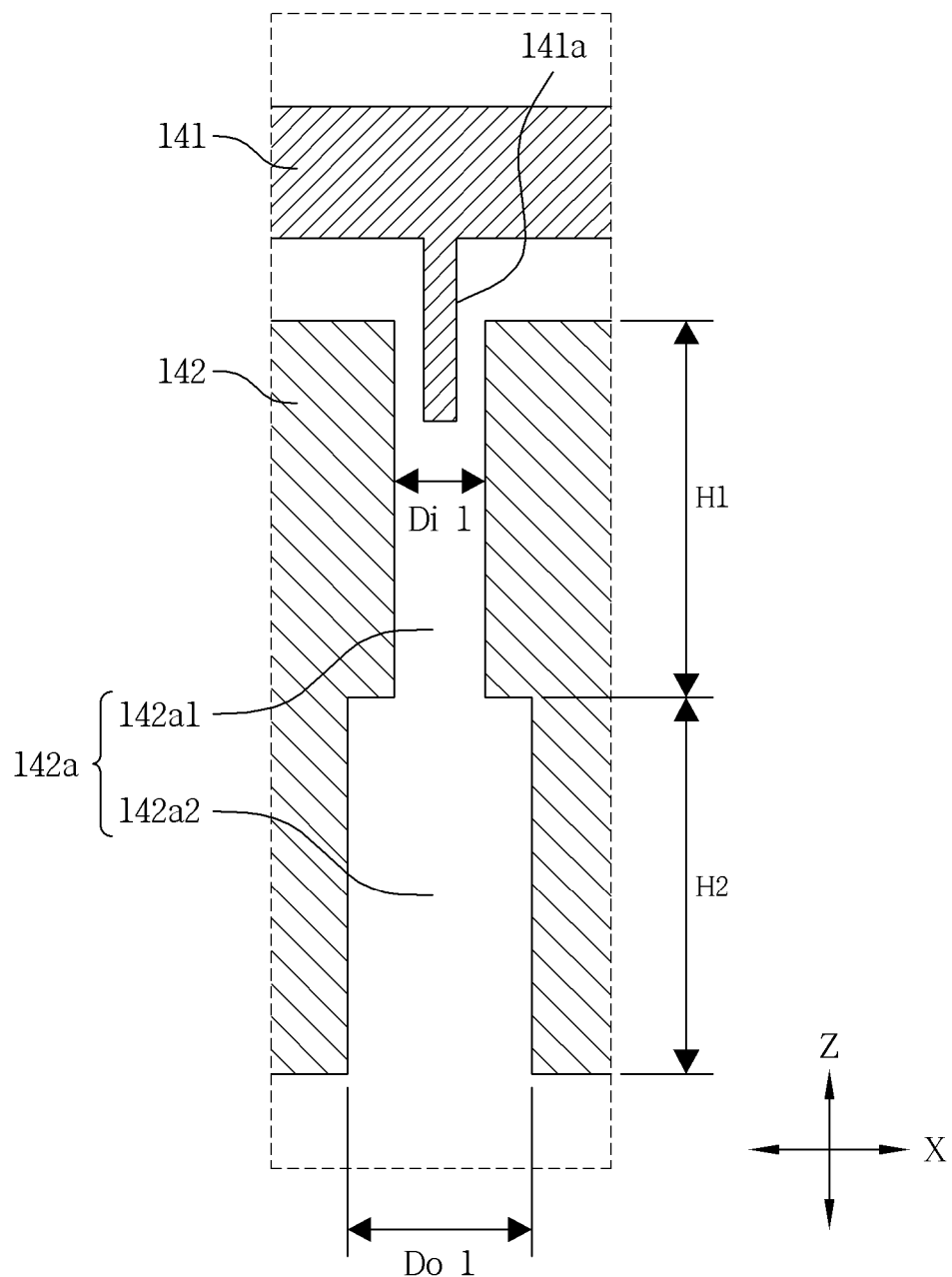
FIG. 3 is an enlarged view of portion "C" of FIG. 2.

FIG. 2 is an enlarged view illustrating a first example of portion "A" of FIG. 1 in the substrate processing apparatus according to the embodiment of the present disclosure. FIG. 3 is an enlarged view of portion "C" of FIG. 2.

Referring to FIGS. 2 and 3, each insertion hole 142a in the substrate processing apparatus according to the embodiment of the present disclosure includes a first hole 142a1 at an upper portion thereof, an associated one of the protruding electrodes being inserted into the first hole 142a1, and a second hole 142a2 at a lower portion thereof facing the upper portion. The first hole 142a1 has a first opening, and the second hole 142a2 has a second opening. In this case, it can be seen that a first opening area Di as the opening area of the first opening is different from a second opening area Do as the opening area of the second opening.

Meanwhile, the first opening areas Di may be implemented differently for each region.

That is, as illustrated in FIG. 2, the first opening areas Di in the substrate processing apparatus according to the embodiment of the present disclosure may be implemented differently at a center of the second electrode 142, at a periphery of the center, and at an edge of the second electrode 142. The first opening area Di 1 at the center of the second electrode 142 may be smaller than the first opening areas Di 2, Di 3, . . . at the periphery of the center of the second electrode and the first opening area Di n at the edge of the second electrode.

That is, the first opening areas Di increase from the center via the periphery toward the edge of the second electrode 142. As such, by increasing the sizes of the first opening areas Di from the center toward the edge, the flow rate of gas is slower at the edge than at the center, thereby increasing the residence time of the gas in the reaction space and increasing a plasma density.

Each first opening area Di is an area of the associated insertion hole 142a passing through the upper surface of the second electrode 142, and each second opening area Do is an area of the associated insertion hole 142a passing through the lower surface of the second electrode 142.

Meanwhile, in the substrate processing apparatus according to the embodiment of the present disclosure, the insertion hole 142a of the first example may include a first region having a first height H1 and the first opening and a second region having a second height H2 and the second opening, which are directed from the upper portion toward the lower portion of the insertion hole in the direction of insertion of the protruding electrode. The first region is a region corresponding to the first hole 142a1, and the second region is a region corresponding to the second hole 142a2. The first region and the first hole will be designated by the same reference numeral, and the second region and the second hole will be designated by the same reference numeral.

The first region 142a1 corresponds to an upper portion of the insertion hole 142a according to the first example. The first region has the first opening area Di in the vertical direction (Z-axis direction) and is positioned above the second region 142a2. The first region 142a1 may be formed such that the upper end thereof passes through the upper surface of the second electrode 142 and the lower end thereof is connected to the second region 142a2.

The second region 142a2 corresponds to a lower portion of the insertion hole 142a according to the first example. The second region 142a2 has the second opening area Do in the vertical direction and is positioned beneath the first region 142a1. The second region 142a2 has an upper end connected to the first region 142a1 and a lower end passing through the lower surface of the second electrode 142.

That is, in the substrate processing apparatus according to the embodiment of the present disclosure, the insertion hole 142a of the first example includes the first region 142a1 having the first height H1 and the first opening area Di 1 and the second region 142a2 having the second height H2 and the second opening area Do 1, and the second height H2 and the second opening area Do 1 are larger than the first height H1 and the first opening area Di 1. Accordingly, as the gas exiting the first hole as the first region 142a1 is diffused in the second hole as the second region 142a2, the flow rate of the gas is reduced and the residence time of the gas in the reaction space is thus longer.

In this case, the first height H1 is preferably smaller than the second height H2. Thus, it is possible to obtain an effect of reducing the flow rate of the gas by increasing a region in which the gas exiting the first region 142a1 is diffused.

Figure 4:
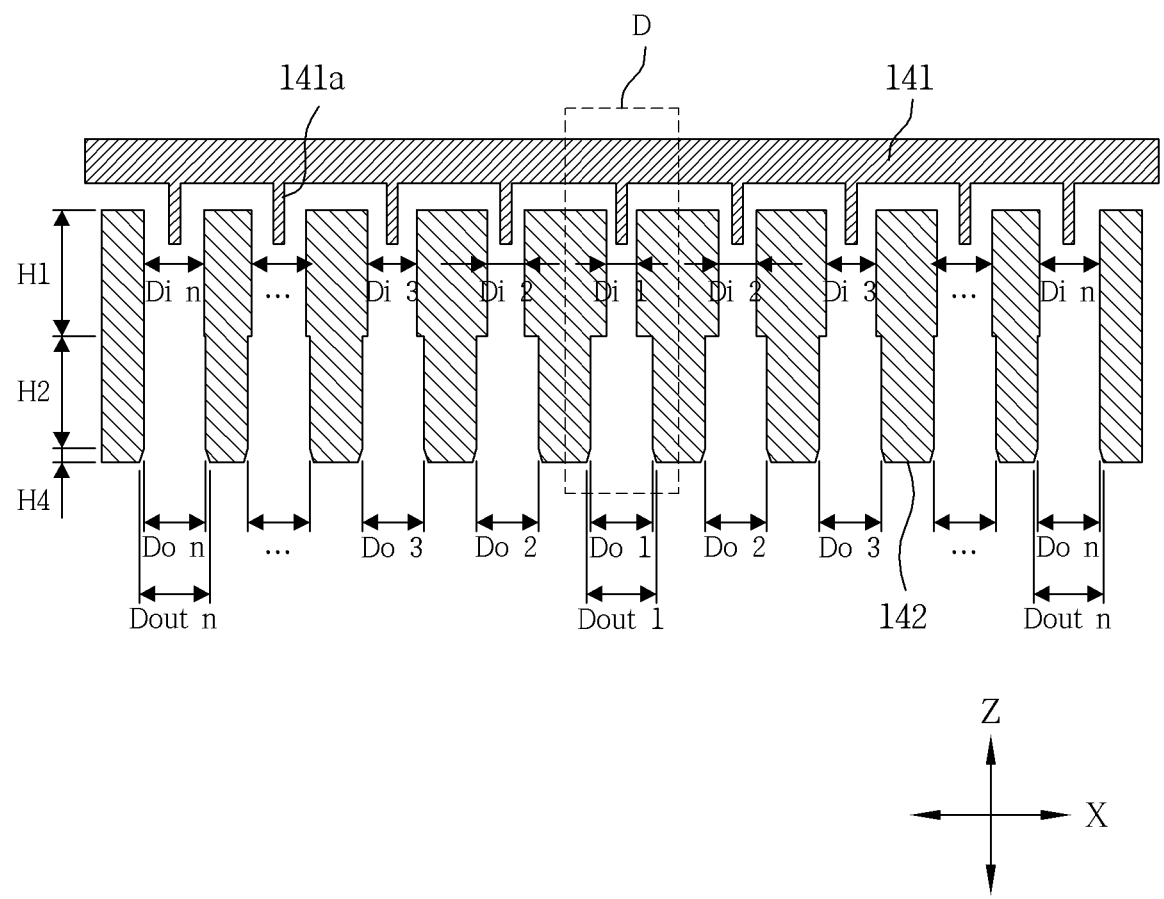
FIG. 4 is an enlarged view illustrating a second example of portion "A" of FIG. 1 in the substrate processing apparatus according to the embodiment of the present disclosure.
Figure 5:
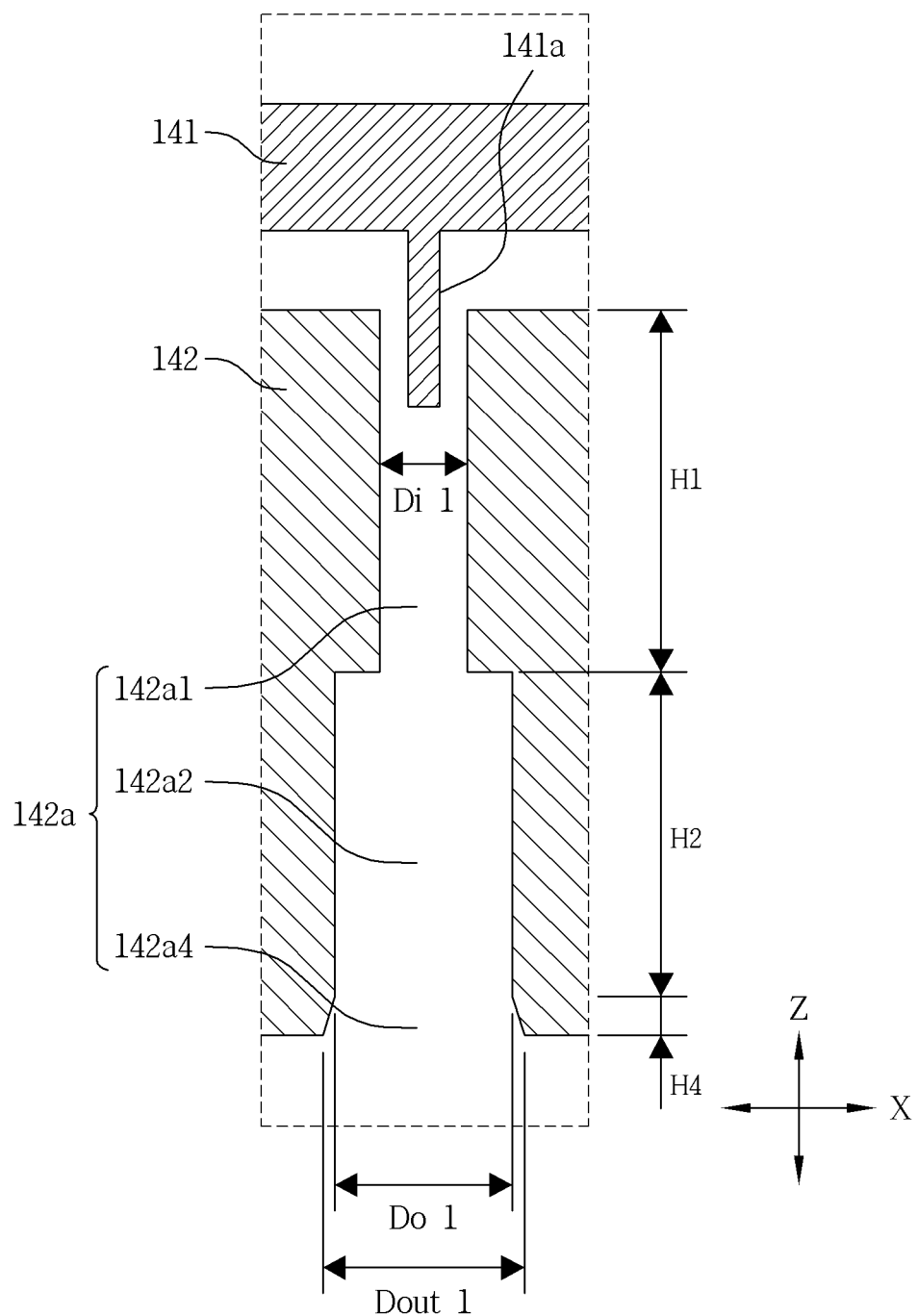
FIG. 5 is an enlarged view of portion "D" of FIG. 4.

FIG. 4 is an enlarged view illustrating a second example of portion "A" of FIG. 1 in the substrate processing apparatus according to the embodiment of the present disclosure. FIG. 5 is an enlarged view of portion "D" of FIG. 4.

The second example of the substrate processing apparatus according to the embodiment of the present disclosure illustrated in FIGS. 4 and 5 differs from the first example of the substrate processing apparatus according to the embodiment of the present disclosure illustrated in FIGS. 2 and 3 in that each insertion hole 142a has a tapered lower opening.

In the substrate processing apparatus according to the embodiment of the present disclosure, the insertion hole 142a of the second example may include a first region 142a1 having a first height H1, a second region 142a2 having a second height H2, and a fourth region 142a4 having a fourth height H4.

The first region 142a1 corresponds to an upper portion of the insertion hole 142a according to the second example. The first region 142a1 has a first opening area Di in the vertical direction and is positioned above the second region 142a2. The first region 142a1 may be formed such that the upper end thereof passes through the upper surface of the second electrode 142 and the lower end thereof is connected to the second region 142a2.

The second region 142a2 is positioned beneath the first region 142a1. The second region 142a2 may be formed such that the upper end thereof is connected to the lower portion of the first region 142a1 and the lower end thereof is connected to the fourth region 142a4. The second region 142a2 has a second opening area Do at both of the upper and lower ends thereof in the vertical direction.

The fourth region 142a4 is positioned beneath the second region 142a2. The fourth region 142a4 has a second opening area Do 1 at the upper end thereof and a third opening area Dout 1 at the lower end thereof in the vertical direction. The upper end of the fourth region 142a4 is connected to the second region 142a2, and the lower end of the fourth region 142a4 passes through the lower surface of the second electrode 142.

As illustrated in FIG. 5, in the second example of the substrate processing apparatus according to the embodiment of the present disclosure, it can be seen that the first opening area Di 1, which is an upper opening area of the insertion hole 142a, the second opening area Do 1, which is an intermediate opening area of the insertion hole 142a, and the third opening area Dout 1, which is a lower opening area of the insertion hole 142a, are different from each other.

When the third opening area Dout 1 is larger than the second opening area Do 1, the gas exiting the first and second regions 142a1 and 142a2 is diffused in a larger amount in the fourth region 142a4, compared to the first example of the present disclosure. Accordingly, the flow rate of the gas is reduced and the residence time of the gas in the reaction space is thus longer.

Figure 6:
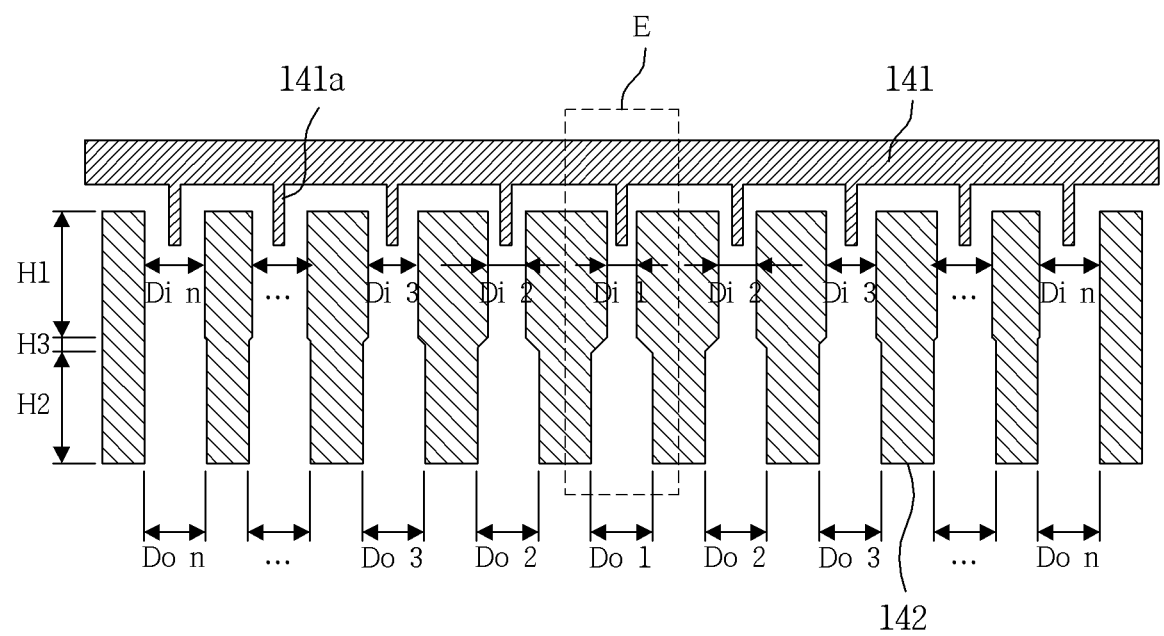
FIG. 6 is an enlarged view illustrating a third example of portion "A" of FIG. 1 in the substrate processing apparatus according to the embodiment of the present disclosure.
Figure 7:
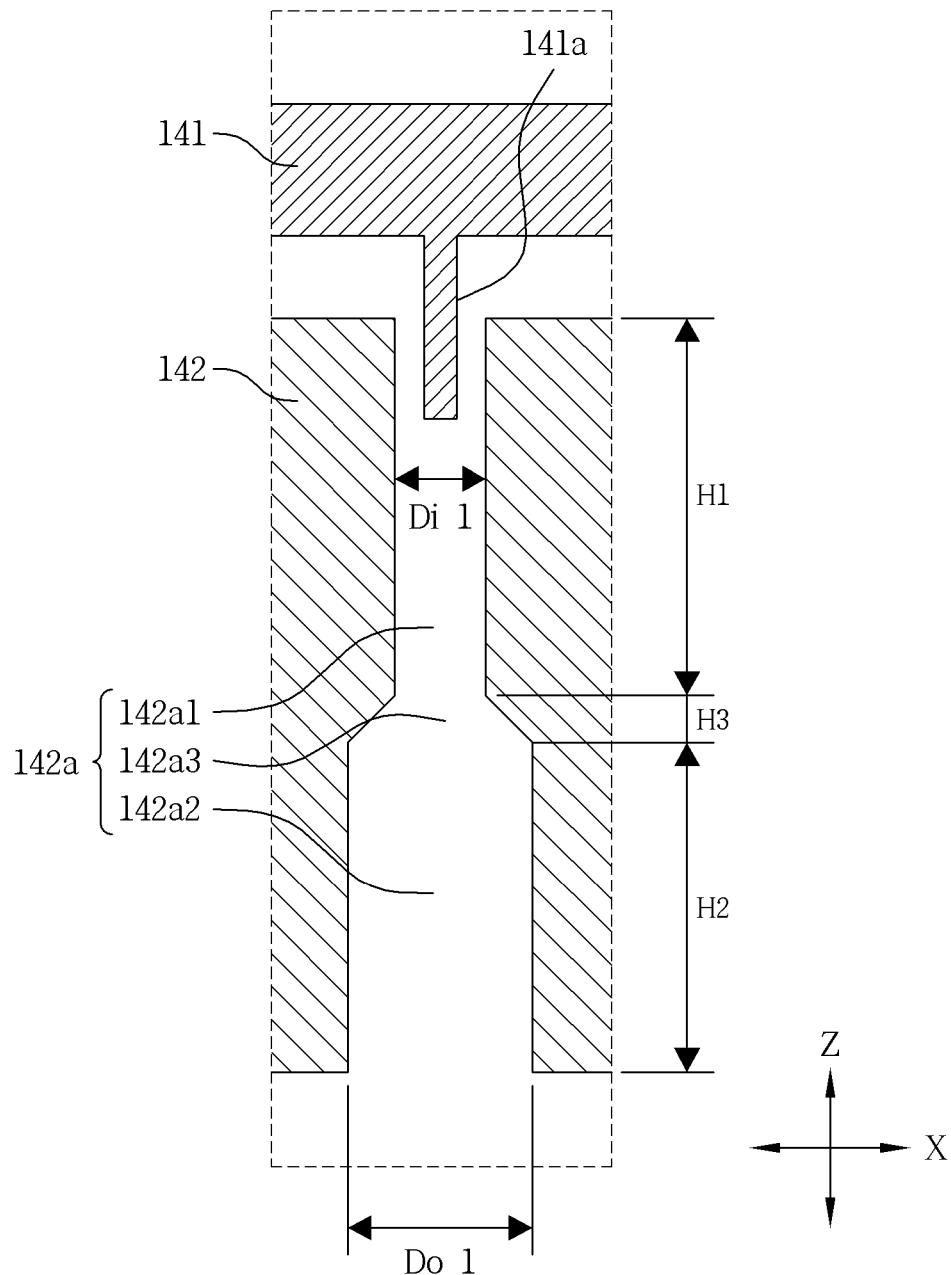
FIG. 7 is an enlarged view of portion "E" of FIG. 6.

FIG. 6 is an enlarged view illustrating a third example of portion "A" of FIG. 1 in the substrate processing apparatus according to the embodiment of the present disclosure. FIG. 7 is an enlarged view of portion "E" of FIG. 6.

The third example of the substrate processing apparatus according to the embodiment of the present disclosure illustrated in FIGS. 6 and 7 differs from the first example of the substrate processing apparatus according to the embodiment of the present disclosure illustrated in FIGS. 2 and 3 in that each insertion hole 142a has a tapered intermediate portion.

In the substrate processing apparatus according to the embodiment of the present disclosure, the insertion hole 142a of the third example may include a first region 142a1 having a first height H1, a second region 142a2 having a second height H2, and a third region 142a3 having a third height H3.

The first region 142a1 corresponds to an upper portion of the insertion hole 142a according to the third example. The first region 142a1 has a first opening area Di in the vertical direction and has an upper end passing through the upper surface of the second electrode 142.

The second region 142a2 corresponds to a lower portion of the insertion hole 142a according to the third example. The second region 142a2 has a second opening area Do in the vertical direction and passes through the lower surface of the second electrode 142.

The third region 142a3 is positioned between the first region 142a1 and the second region 142a2 and may be tapered in the vertical direction. The third region 142a3 has a first opening area Di at the upper end thereof and a second opening area Do at the lower end thereof in the vertical direction.

In the third example of the substrate processing apparatus according to the embodiment of the present disclosure, due to the above structure, gas is diffused while entering the third region 142a3 from the first region 142a1. Accordingly, the gas is additionally diffused while flowing along the third region 142a3 and the second region 142a2 at a reduced flow rate. Therefore, the insertion hole 142a according to the third example of the present disclosure enables the flow rate of the gas to be further reduced, thereby achieving effects of further extending the residence time of the gas and further increasing a plasma density, as compared with the insertion hole 142a according to the first example.

Figure 8:
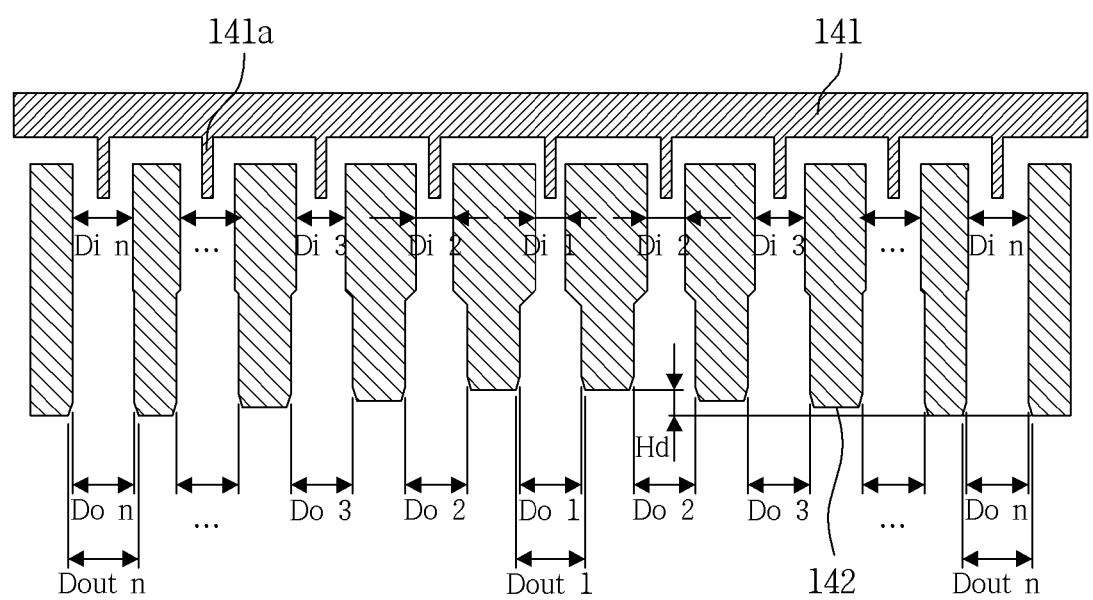
FIG. 8 is an enlarged view illustrating a fourth example of portion "A" of FIG. 1 in the substrate processing apparatus according to the embodiment of the present disclosure.

FIG. 8 is an enlarged view illustrating a fourth example of portion "A" of FIG. 1 in the substrate processing apparatus according to the embodiment of the present disclosure.

Referring to FIG. 8, in the fourth example of the substrate processing apparatus according to the embodiment of the present disclosure, it can be seen that the second electrode 142 has an upper surface parallel to the first electrode 141 and a dome-shaped lower surface recessed at the center thereof. Since the second electrode 142 has the dome-shaped lower surface so that the second height H2 at the center of the second electrode 142 is lower than the second height H2 at the edge of the second electrode 142, the distance between the second electrode 142 and the substrate support 120 is decreased from the center toward the edge of the second electrode 142.

Accordingly, a plasma density is decreased at the center of the second electrode and is increased at the edge thereof. As a result, it is possible to form a uniform thin film on the substrate in the large-area substrate processing apparatus.

Alternatively, the lower surface of the second electrode 142 may have a stepped shape instead of the concave recessed dome shape. In this case, the lower surface at the center of the second electrode 142 and the lower surface at the edge of the second electrode 142 preferably have a height difference Hd of 5 mm to 10 mm.

As described above, the substrate processing apparatus according to the embodiment of the present disclosure is advantageous in that it can enhance efficiency in the substrate processing process by decreasing the flow rate and increasing residence time of gas and the plasma density in the process of supplying the gas through the shape forming of the electrode module including the first and second electrodes.

Figure 9:
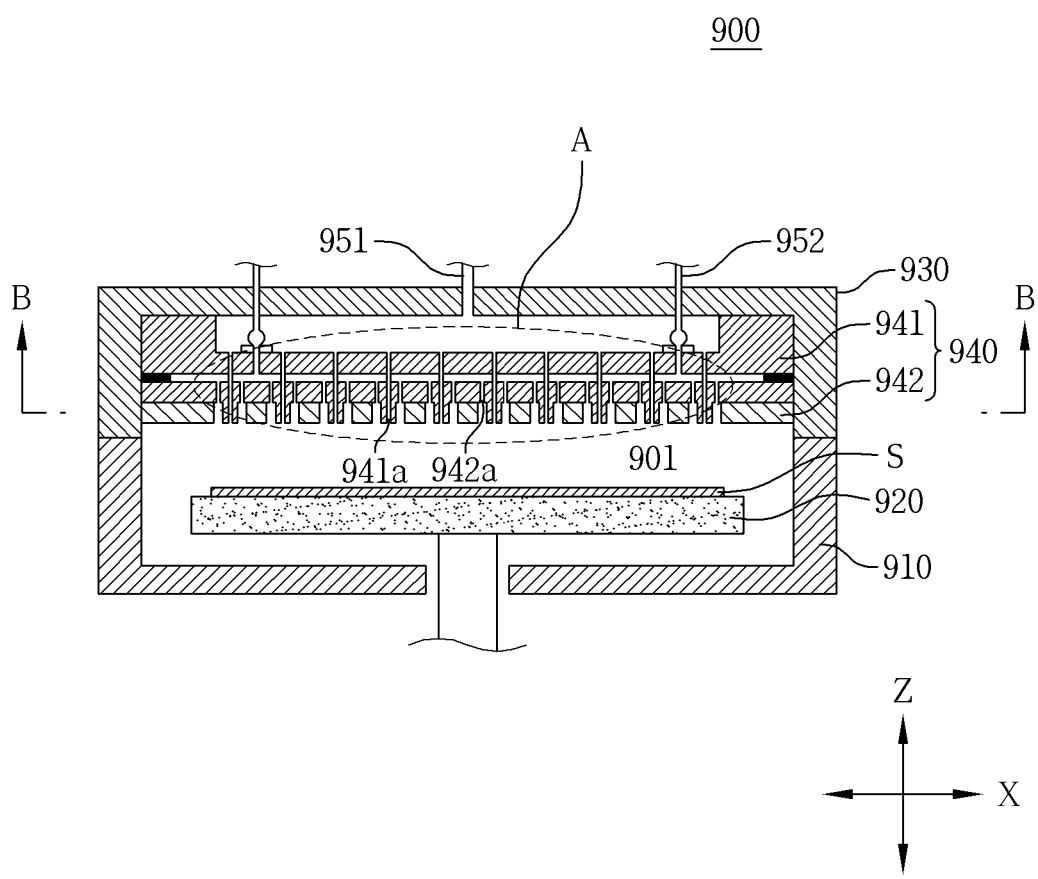
FIG. 9 is a cross-sectional view illustrating a substrate processing apparatus according to another embodiment of the present disclosure.

FIG. 9 is a cross-sectional view illustrating a substrate processing apparatus according to another embodiment of the present disclosure.

As illustrated in FIG. 9, the substrate processing apparatus, which is designated by reference numeral 900, according to another embodiment of the present disclosure includes a process chamber 910, a substrate support 920, a chamber lid 930, and a gas injection module 940 including a first injection plate 941 and a second injection plate 942 which face the substrate support.

The process chamber 910 provides a reaction space 901 for processing a substrate(s). The bottom on one side of the process chamber 910 may communicate with an exhaust port (not shown) for exhausting gas from the reaction space 901.

The substrate support 920 is installed inside the process chamber 910 and supports a plurality of substrates S or a single large-area substrate S. The substrate support 920 is supported by a support shaft (not shown) passing through the central bottom of the process chamber 910. The support shaft exposed out of the lower surface of the process chamber 910 is sealed by a bellows (not shown) installed on the lower surface of the process chamber 910. The substrate support 920 may be raised or lowered by a drive unit (not shown), and may also be rotated by driving the drive unit in some cases.

The chamber lid 930 is installed to cover the upper portion of the process chamber 910 to seal the reaction space 901. The chamber lid 930 supports the gas injection module 940, which includes the first injection plate 941 to inject first gas and the second injection plate 942 to inject second gas, and the gas injection module 940 is inserted into and detachably coupled to the chamber lid 930.

The chamber lid 930 may be provided, on the upper surface thereof, with a first gas supply unit (not shown) and a second gas supply unit (not shown) to supply the first gas and the second gas to the gas injection module 940 within the process chamber 910.

The first gas supply unit (not shown) supplies reaction gas as the first gas to the gas injection module 940 through a first gas supply line 951. The reaction gas refers to gas for plasma formation or for incidental reaction. For example, the reaction gas may be comprised of hydrogen ($H_2$), nitrogen ($N_2$), oxygen ($O_2$), nitrogen dioxide ($N_2O$), ammonia ($NH_3$), water ($H_2O$), ozone ($O_3$), or the like.

The second gas supply unit (not shown) supplies source gas as the second gas to the gas injection module 940 through a second gas supply line 952. The source gas refers to gas containing a main component of a thin film to be formed. For example, the source gas may be gas containing silicon (Si), a titanium group element (e.g., Ti, Zr, or Hf), aluminum (Al), or the like.

A plasma power supply (not shown) for supply of plasma power may be installed outside the process chamber 910.

The first and second injection plates 941 and 942 of the gas injection module 940 may be detachably coupled to the upper portion of the process chamber so as to face the substrate support 920.

The first injection plate 941 injects the first gas into the reaction space, and the second injection plate 942 injects the second gas into the reaction space.

The first injection plate 941 is installed in the process chamber and includes a plurality of protruding nozzles 941a protruding toward the substrate(s) S.

The respective protruding nozzles 941a of the first injection plate 941 may be formed with a plurality of first gas injection holes 941b so that the first gas supplied from the first gas supply unit (not shown) through the first gas supply line 951 may be injected to the substrate(s) S.

In this case, the first gas may be injected to the substrate(s) S, or may be injected between the protruding nozzles 941a and the first gas injection holes 941b according to the length of each protruding nozzle 941a.

The first injection plate 941 may have a structure such as a polygonal flat plate or a circular plate. The protruding nozzles 941a may be integral with or separated from the first injection plate 941, and may be connected to the first injection plate 941 to have the same voltage as the first injection plate 941.

The second injection plate 942 may be formed with a plurality of second gas injection holes 942a so that the second gas supplied through the second gas supply line 952 may be injected to the substrate(s) S.

The second injection plate 942 may have a structure such as a polygonal flat plate or a circular plate. The second injection plate 942 may be installed in the process chamber and a have a plurality of second gas injection holes 942a formed to allow the respective protruding nozzles 941a to pass therethrough.

Figure 10:
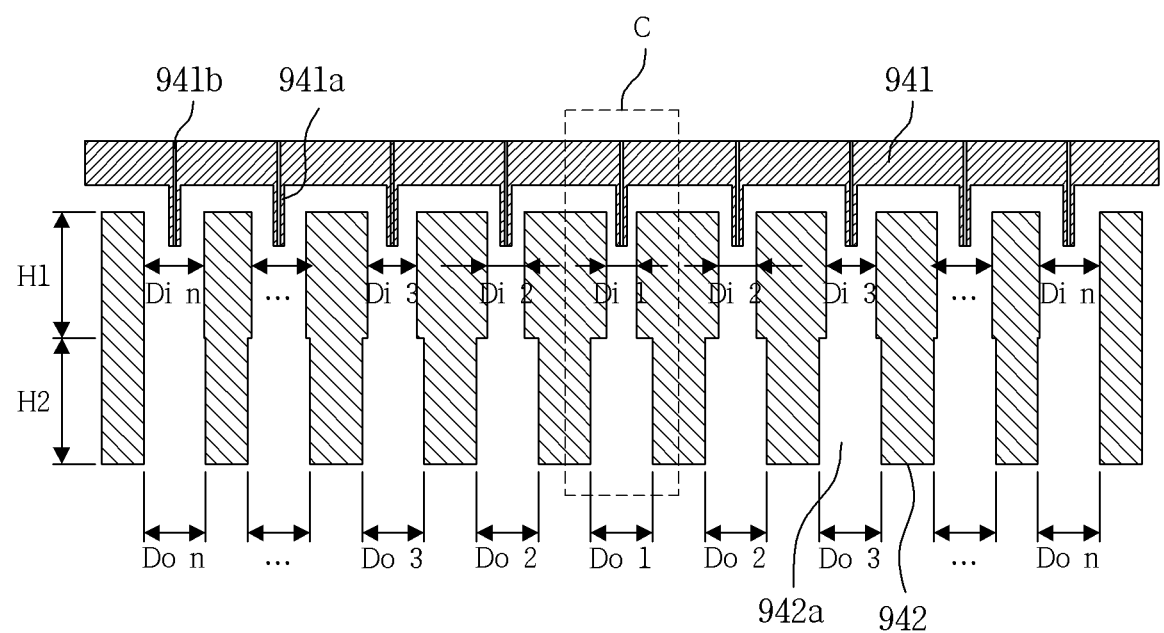
FIG. 10 is an enlarged view illustrating a first example of portion "A" of FIG. 9 in the substrate processing apparatus according to the embodiment of the present disclosure.
Figure 11:
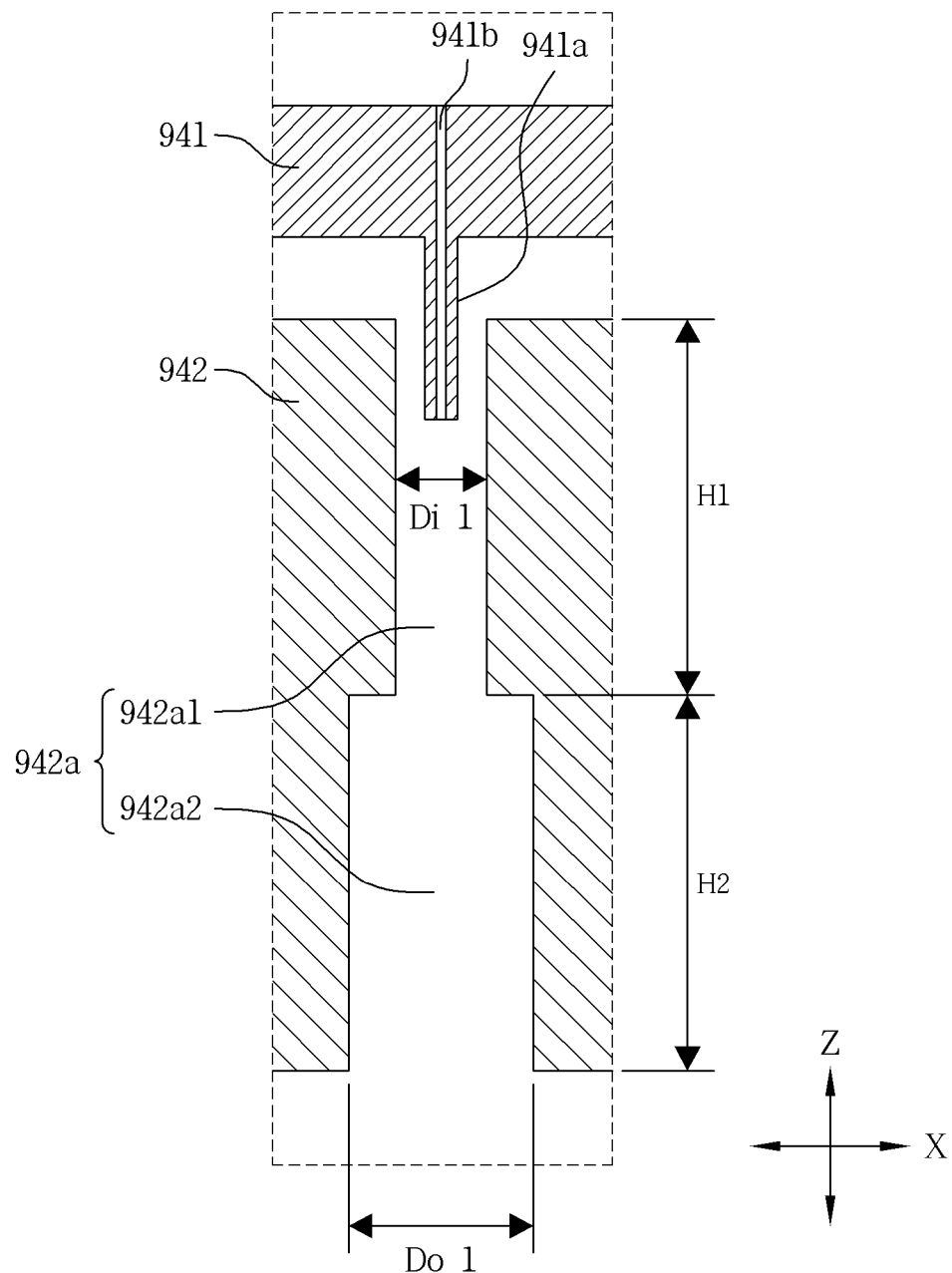
FIG. 11 is an enlarged view of portion "C" of FIG. 10.

FIG. 10 is an enlarged view illustrating a first example of portion "A" of FIG. 9 in the substrate processing apparatus according to the embodiment of the present disclosure. FIG. 11 is an enlarged view of portion "C" of FIG. 10.

Referring to FIGS. 10 and 11, in the substrate processing apparatus 900 according to the embodiment of the present disclosure, it can be seen that a first opening area Di 1 as the upper opening area of each second gas injection hole 942a is different from a second opening area Do 1 as the lower opening area of the second gas injection hole 942a.

Meanwhile, the first opening areas Di may be implemented differently for each region.

That is, as illustrated in FIG. 10, the first opening areas Di in the substrate processing apparatus 900 according to the embodiment of the present disclosure may be implemented differently at a center of the second injection plate 942, at a periphery of the center, and at an edge of the second injection plate 942. The first opening area Di 1 at the center of the second injection plate 942 may be smaller than the first opening areas Di 2, Di 3, . . . at the periphery of the center of the second injection plate 942 and the first opening area Di n at the edge of the second injection plate 942.

That is, the first opening areas Di increase from the center via the periphery toward the edge of the second injection plate 942. As such, by increasing the sizes of the first opening areas Di from the center toward the edge, the flow rate of gas is slower at the edge than at the center, thereby increasing the residence time of the gas in the reaction space and increasing a plasma density.

Each first opening area Di 1 is an area of the associated second gas injection hole 942a passing through the upper surface of the second injection plate 942, and each second opening area Do 1 is an area of the associated second gas injection hole 942a passing through the lower surface of the second injection plate 942.

In the substrate processing apparatus according to the embodiment of the present disclosure, the second gas injection hole 942a may include a first region 942a1 having a first height H1 and a second region 942a2 having a second height H2 in the direction of insertion of the protruding nozzle 941a. The first region is a region corresponding to a first hole 942a1, and the second region is a region corresponding to a second hole 942a2. The first region and the first hole will be designated by the same reference numeral, and the second region and the second hole will be designated by the same reference numeral.

The first region 942a1 corresponds to an upper portion of the second gas injection hole 942a. The first region 942a1 has the first opening area Di 1 in the vertical direction (Z-axis direction) and is positioned above the second region 942a2. The first region 942a1 may be formed such that the upper end thereof passes through the upper surface of the second injection plate 942 and the lower end thereof is connected to the second region 942a2.

The second region 942a2 corresponds to a lower portion of the second gas injection hole 942a. The second region 942a2 has the second opening area Do 2 in the vertical direction and is positioned beneath the first region 942a1. The second region 942a2 has an upper end connected to the first region 942a1 and a lower end passing through the lower surface of the second injection plate 942.

That is, in the substrate processing apparatus according to the embodiment of the present disclosure, the second gas injection hole 942a includes the first region 942a1 having the first height H1 and the first opening area Di 1 and the second region 942a2 having the second height H2 and the second opening area Do 1, and the second height H2 and the second opening area Do 1 are larger than the first height H1 and the first opening area Di 1. Accordingly, as the gas exiting the first region 942a1 is diffused in the second region 942a2, the flow rate of the gas is reduced and the residence time of the gas in the reaction space is thus longer.

In this case, the first height H1 is preferably smaller than the second height H2. Thus, it is possible to obtain an effect of reducing the flow rate of the gas by increasing a region in which the gas exiting the first region 942a1 is diffused.

Figure 12:
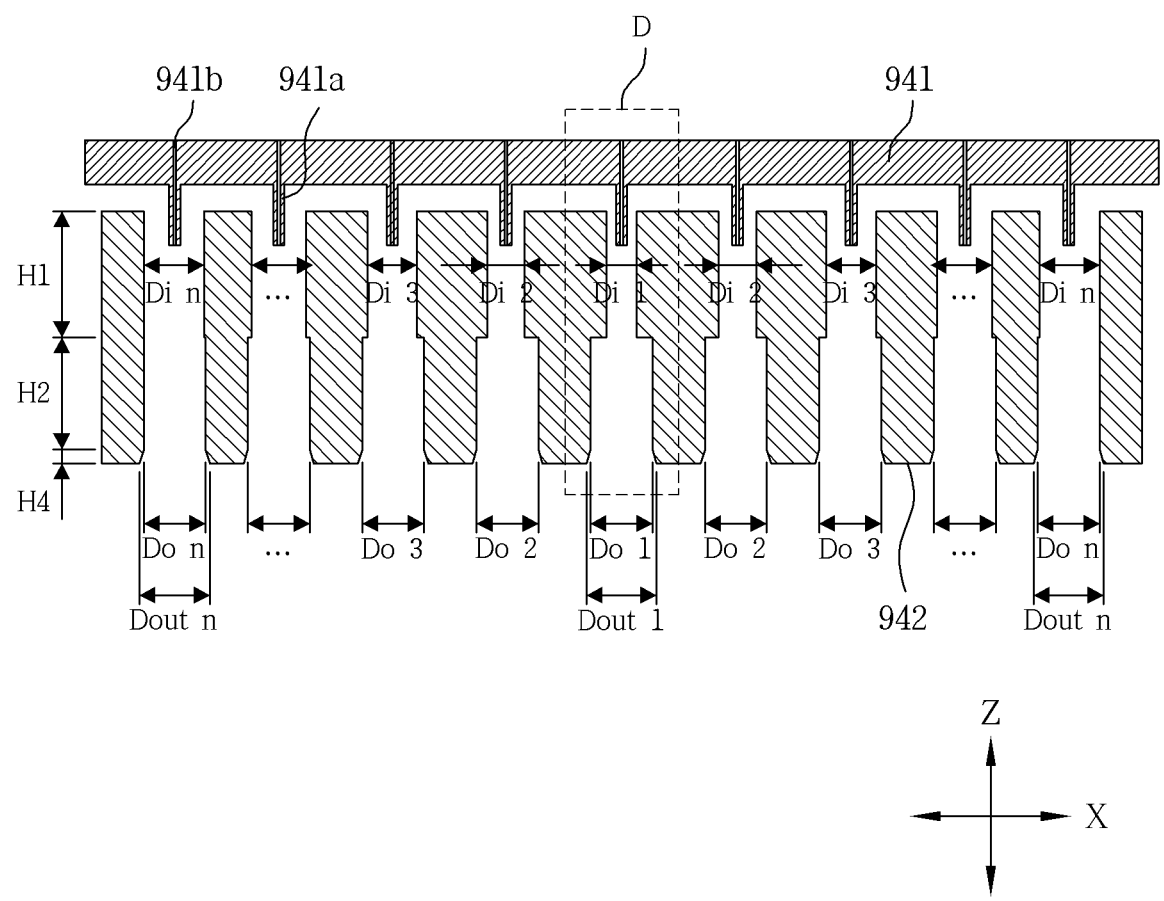
FIG. 12 is an enlarged view illustrating a second example of portion "A" of FIG. 9 in the substrate processing apparatus according to the embodiment of the present disclosure.
Figure 13:
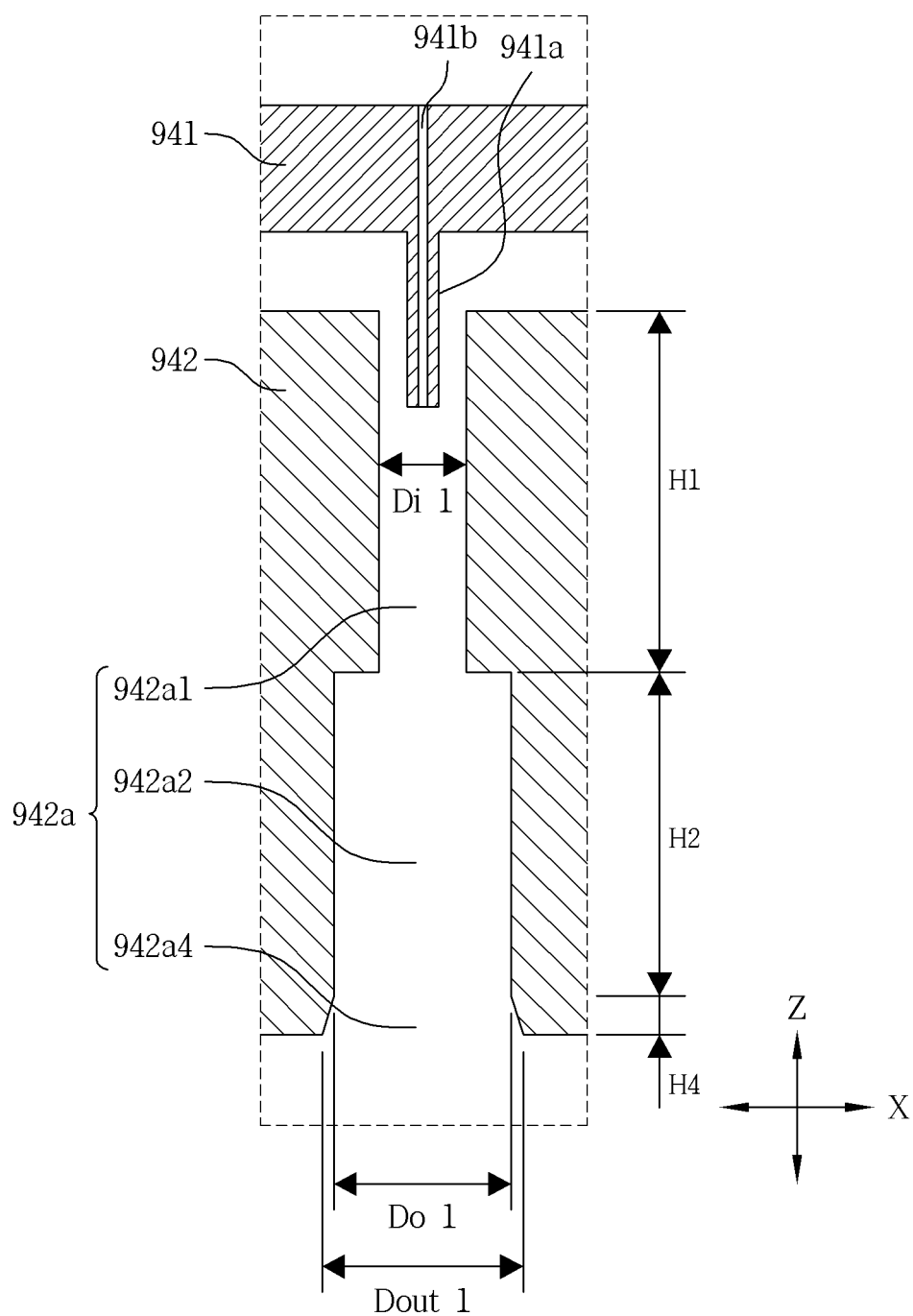
FIG. 13 is an enlarged view of portion "D" of FIG. 12.

FIG. 12 is an enlarged view illustrating a second example of portion "A" of FIG. 9 in the substrate processing apparatus according to the embodiment of the present disclosure. FIG. 13 is an enlarged view of portion "D" of FIG. 12.

The second example of the substrate processing apparatus according to the embodiment of the present disclosure illustrated in FIGS. 12 and 13 differs from the first example of the substrate processing apparatus according to the embodiment of the present disclosure illustrated in FIGS. 10 and 11 in that each second gas injection hole 942a has a tapered lower opening.

In the substrate processing apparatus according to the embodiment of the present disclosure, the second gas injection hole 942a of the second example may include a first region 942a1 having a first height H1, a second region 942a2 having a second height H2, and a fourth region 942a4 having a fourth height H4.

The first region 942a1 corresponds to an upper portion of the second gas injection hole 942a according to the second example. The first region 942a1 has a first opening area Di in the vertical direction and is positioned above the second region 942a2. The first region 942a1 may be formed such that the upper end thereof passes through the upper surface of the second injection plate 942 and the lower end thereof is connected to the second region 942a2.

The second region 942a2 is positioned beneath the first region 942a1. The second region 942a2 may be formed such that the upper end thereof is connected to the lower portion of the first region 942a1 and the lower end thereof is connected to the fourth region 942a4. The second region 942a2 has a second opening area Do at both of the upper and lower ends thereof in the vertical direction.

The fourth region 942a4 is positioned beneath the second region 942a2. The fourth region 942a4 has a second opening area Do 1 at the upper end thereof and a third opening area Dout 1 at the lower end thereof in the vertical direction. The upper end of the fourth region 942a4 is connected to the second region 942a2, and the lower end of the fourth region 942a4 passes through the lower surface of the second injection plate 942.

As illustrated in FIG. 13, in the second example of the substrate processing apparatus according to the embodiment of the present disclosure, it can be seen that the first opening area Di 1, which is an upper opening area of the second gas injection hole 942a, the second opening area Do 1, which is an intermediate opening area of the second gas injection hole 942a, and the third opening area Dout 1, which is a lower opening area of the second gas injection hole 942a, are different from each other.

When the third opening area Dout 1 is larger than the second opening area Do 1, the gas exiting the first and second regions 942a1 and 942a2 is diffused in a larger amount in the fourth region 942a4, compared to the first example of the present disclosure. Accordingly, the flow rate of the gas is reduced and the residence time of the gas in the reaction space is thus longer.

Figure 14:
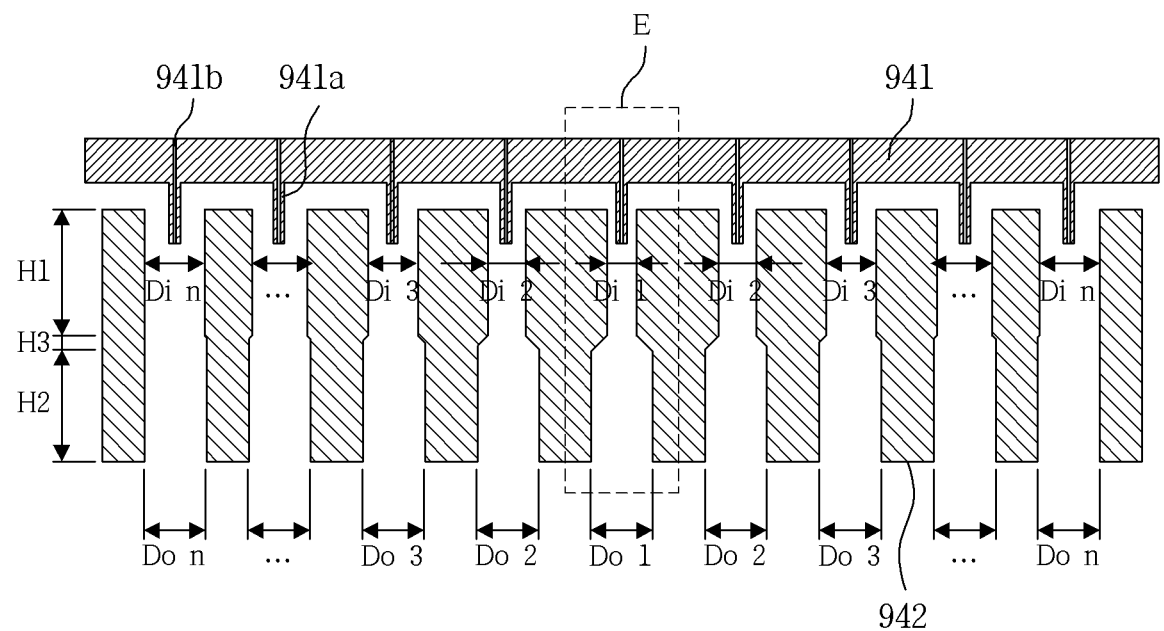
FIG. 14 is an enlarged view illustrating a third example of portion "A" of FIG. 9 in the substrate processing apparatus according to the embodiment of the present disclosure.
Figure 15:
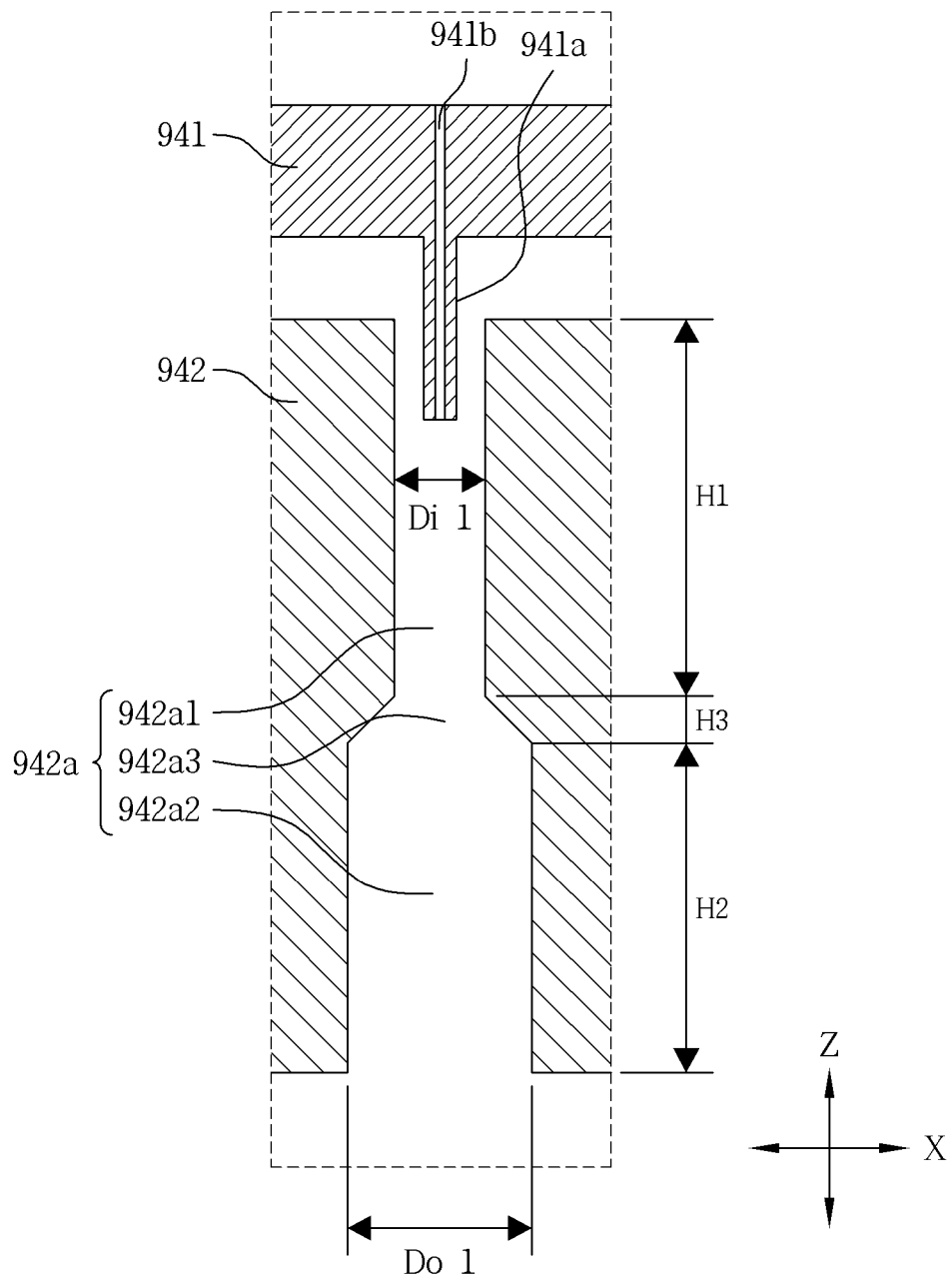
FIG. 15 is an enlarged view of portion "E" of FIG. 14.

FIG. 14 is an enlarged view illustrating a third example of portion "A" of FIG. 9 in the substrate processing apparatus according to the embodiment of the present disclosure. FIG. 15 is an enlarged view of portion "E" of FIG. 14.

The third example of the substrate processing apparatus according to the embodiment of the present disclosure illustrated in FIGS. 14 and 15 differs from the first example of the substrate processing apparatus according to the embodiment of the present disclosure illustrated in FIGS. 10 and 11 in that each second gas injection hole 942*a* has a tapered intermediate portion.

In the substrate processing apparatus according to the embodiment of the present disclosure, the second gas injection hole 942*a* of the third example may include a first region 942*a*1 having a first height H1, a second region 942*a*2 having a second height H2, and a third region 942*a*3 having a third height H3.

The first region 942*a*1 corresponds to an upper portion of the second gas injection hole 942*a* according to the third example. The first region 942*a*1 has a first opening area Di in the vertical direction and has an upper end passing through the upper surface of the second injection plate 942.

The second region 942*a*2 corresponds to a lower portion of the second gas injection hole 942*a* according to the third example. The second region 942*a*2 has a second opening area Do in the vertical direction and passes through the lower surface of the second injection plate 942.

The third region 942*a*3 is positioned between the first region 942*a*1 and the second region 942*a*2 and may be tapered in the vertical direction. The third region 942*a*3 has a first opening area Di at the upper end thereof and a second opening area Do at the lower end thereof in the vertical direction.

In the third example of the substrate processing apparatus according to the embodiment of the present disclosure, due to the above structure, gas is diffused while entering the third region 942*a*3 from the first region 942*a*1. Accordingly, the gas is additionally diffused while flowing along the third region 942*a*3 and the second region 942*a*2 at a reduced flow rate. Therefore, the second gas injection hole 942*a* according to the third example of the present disclosure enables the flow rate of the gas to be further reduced, thereby achieving effects of further extending the residence time of the gas and further increasing a plasma density, as compared with the second gas injection hole 942*a* according to the first example.

Figure 16:
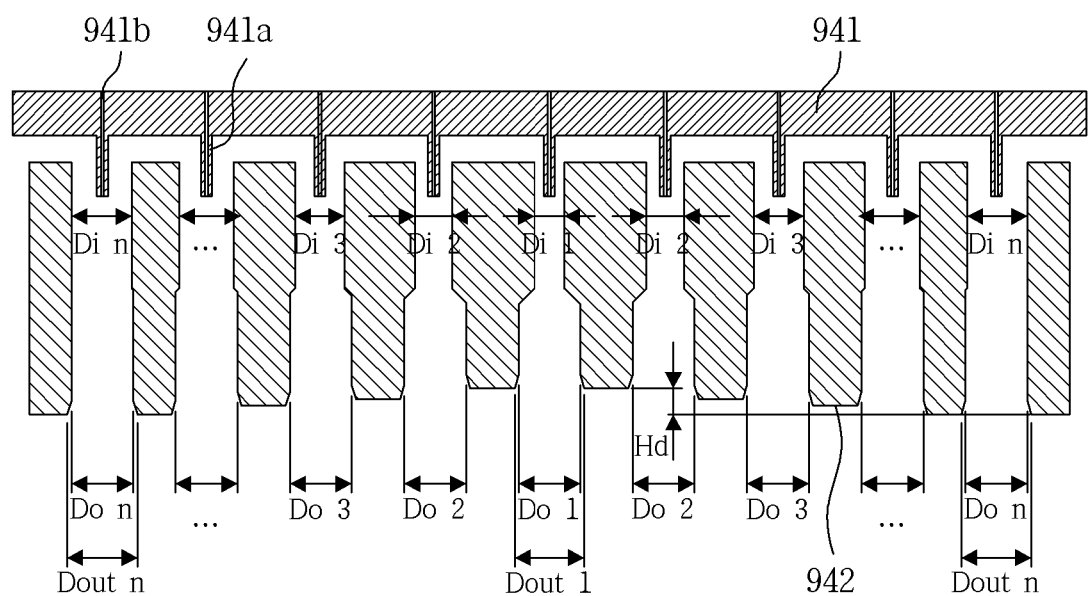
FIG. 16 is an enlarged view illustrating a fourth example of portion "A" of FIG. 9 in the substrate processing apparatus according to the embodiment of the present disclosure.

FIG. 16 is an enlarged view illustrating a fourth example of portion "A" of FIG. 9 in the substrate processing apparatus according to the embodiment of the present disclosure.

Referring to FIG. 16, in the fourth example of the substrate processing apparatus according to the embodiment of the present disclosure, it can be seen that the second injection plate 942 has an upper surface parallel to the first injection plate 941 and a dome-shaped lower surface recessed at the center thereof. Since the second injection plate 942 has the dome-shaped lower surface so that the second height H2 at the center of the second injection plate 942 is lower than the second height H2 at the edge of the second injection plate 942, the distance between the second injection plate 942 and the substrate support 920 is decreased from the center toward the edge of the second injection plate 942.

Accordingly, a plasma density is decreased at the center of the second injection plate and is increased at the edge thereof. As a result, it is possible to form a uniform thin film on the substrate in the large-area substrate processing apparatus.

Alternatively, the lower surface of the second injection plate 942 may have a stepped shape instead of the concave recessed dome shape. In this case, the lower surface at the center of the second injection plate 942 and the lower surface at the edge of the second injection plate 942 preferably have a height difference Hd of 5 mm to 10 mm.

As described above, the substrate processing apparatus according to the embodiment of the present disclosure is advantageous in that it can enhance efficiency in the substrate processing process by decreasing the flow rate and increasing residence time of gas and the plasma density in the process of supplying the gas through the shape forming of the gas injection module including the first and second injection plates.

As apparent from the above description, the substrate processing apparatus according to the present disclosure is configured such that the second electrode as the lower electrode has the insertion hole through which gas is supplied, the opening area of the inlet of the insertion hole is gradually increased from the center toward the edge of the second electrode. Therefore, the substrate processing apparatus is advantageous in that the flow rate of gas is reduced from the center toward the edge of the second electrode and the residence time of the gas is thus increased, thereby extending the time required for film formation.

In addition, the substrate processing apparatus according to the present disclosure is configured such that the second electrode has the concave dome-shaped lower surface and the distance between the second electrode and the substrate is shorter at the center than at the edge of the second electrode. Therefore, the substrate processing apparatus is advantageous in that the plasma density is decreased at the center of the second electrode and is increased at the edge thereof.

In general, the present disclosure is advantageous in that it can enhance efficiency in the substrate processing process by increasing the flow rate and residence time of gas and the plasma density in the process of supplying the gas through the shape forming of the electrode module.

Furthermore, the substrate processing apparatus according to the present disclosure is configured such that the second gas injection hole, into which the protruding nozzle of the first injection plate is inserted, is formed to inject second gas, the opening area of the inlet of the gas injection hole is gradually increased from the center toward the edge of the second injection plate. Therefore, the substrate processing apparatus is advantageous in that the flow rate of the gas exiting the first and second injection plates is reduced from the center toward the edge of the second injection plate and the residence time of the gas is thus increased, thereby extending the time required for film formation.

While various embodiments have been described above, it will be understood to those skilled in the art that the embodiments described are by way of example only. Accordingly, the disclosure described herein should not be limited based on the described embodiments.

What is claimed is:

1. A substrate processing apparatus comprising:
   a process chamber configured to provide a reaction space for processing a substrate;
   a substrate support configured to support the substrate;
   a first electrode installed in the process chamber to face the substrate and having a plurality of protruding electrodes protruding toward the substrate; and
   a second electrode positioned beneath the first electrode and having a plurality of insertion holes into which the respective protruding electrodes are inserted, wherein,
   each of the insertion holes of the second electrode comprises a first hole at its upper portion, an associated one of the protruding electrodes being inserted into the first hole, and a second hole at its lower portion facing the upper portion,
   the first hole has a first opening, and the second hole has a second opening, wherein the insertion hole comprises:
- a first region having a first height and the first opening toward the lower portion from the upper portion of the insertion hole; and
- a second region positioned beneath the first region and having a second height and the second opening, wherein the area of the first opening is smaller than an area of the second opening, and an area of the first opening at a center of the second electrode is smaller than an area of the first opening at an edge of the second electrode, and wherein the area of the second opening at a center of the second electrode is equal to the area of the second opening at an edge of the second electrode.

2. The substrate processing apparatus according to claim 1, wherein the first hole is configured such that the area of the first opening is increased from the center toward the edge of the second electrode.

3. The substrate processing apparatus according to claim 1, wherein:
- the insertion hole comprises a third region having a third height between the first region and the second region; and
- the third region is tapered.

4. The substrate processing apparatus according to claim 1, wherein the second height at the center of the second electrode is lower than the second height at the edge of the second electrode.

5. The substrate processing apparatus according to claim 1, wherein:
- the insertion hole comprises a fourth region having a fourth height and a third opening beneath the second region; and
- an area of the third opening is equal to or larger than an area of the second opening.

6. A substrate processing apparatus comprising:
- a process chamber configured to provide a reaction space for processing a substrate;
- a substrate support configured to support the substrate;
- a first injection plate installed in the process chamber to face the substrate, and having a first gas injection hole therein and a plurality of protruding nozzles protruding toward the substrate; and
- a second injection plate positioned beneath the first injection plate, and having a plurality of second gas injection holes into which the respective protruding nozzles are inserted and through which second gas is injected, wherein, each of the second gas injection holes of the second injection plate comprises a first hole at its upper portion, an associated one of the protruding nozzles being inserted into the first hole, and a second hole at its lower portion facing the upper portion, the first hole has a first opening, and the second hole has a second opening, wherein the second gas injection hole comprises:
- a first region having a first height and the first opening toward the lower portion from the upper portion of the second gas injection hole; and
- a second region positioned beneath the first region and having a second height and the second opening, wherein the area of the first opening is smaller than an area of the second opening, an area of the first opening at a center of the second injection plate is smaller than an area of the first opening at an edge of the second injection plate, and wherein the area of the second opening at a center of the second injection plate is equal to the area of the second opening at an edge of the second injection plate.

7. The substrate processing apparatus according to claim 6, wherein the first hole is configured such that the area of the first opening is increased from the center toward the edge of the second injection plate.

8. The substrate processing apparatus according to claim 6, wherein:
- the second gas injection hole comprises a third region having a third height between the first region and the second region; and
- the third region is tapered.

9. The substrate processing apparatus according to claim 6, wherein the second height at the center of the second injection plate is lower than the second height at the edge of the second injection plate.

10. The substrate processing apparatus according to claim 6, wherein:
- the second gas injection hole comprises a fourth region having a fourth height and a third opening beneath the second region; and
- an area of the third opening is equal to or larger than an area of the second opening.

* * * * *